(12) United States Patent
Jin et al.

(10) Patent No.: US 11,520,528 B2
(45) Date of Patent: Dec. 6, 2022

(54) SEMICONDUCTOR MEMORY DEVICE AND TEST SYSTEM INCLUDING THE SAME

(71) Applicant: SAMSUNG ELECTRONICS CO., LTD., Suwon-si (KR)

(72) Inventors: Hongjun Jin, Hwaseong-si (KR); Yongjae Lee, Suwon-si (KR); Seunghan Kim, Yongin-si (KR); Hyoungjoo Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/375,168

(22) Filed: Jul. 14, 2021

(65) Prior Publication Data
US 2022/0188027 A1 Jun. 16, 2022

(30) Foreign Application Priority Data

Dec. 14, 2020 (KR) .................. 10-2020-0174328

(51) Int. Cl.
*G06F 3/06* (2006.01)
*G11C 29/56* (2006.01)
*G11C 29/10* (2006.01)

(52) U.S. Cl.
CPC .......... *G06F 3/0659* (2013.01); *G06F 3/0604* (2013.01); *G06F 3/0653* (2013.01); *G06F 3/0673* (2013.01); *G11C 29/10* (2013.01); *G11C 29/56004* (2013.01)

(58) Field of Classification Search
CPC .... G06F 3/0659; G06F 3/0604; G06F 3/0653; G06F 3/0673; G11C 29/00–04; G11C 29/06–48; G11C 2029/0401–0411
See application file for complete search history.

(56) References Cited

U.S. PATENT DOCUMENTS

| | | | |
|---|---|---|---|
| 6,550,023 B1 | 4/2003 | Brauch et al. | |
| 7,791,967 B2 | 9/2010 | Suzuki et al. | |
| 2001/0009524 A1* | 7/2001 | Koto | G11C 29/44 365/201 |
| 2006/0268624 A1* | 11/2006 | Jang | G11C 29/12015 365/194 |
| 2009/0059698 A1 | 3/2009 | Chang et al. | |

FOREIGN PATENT DOCUMENTS

| | | |
|---|---|---|
| JP | H 06-201778 A | 7/1994 |
| JP | 2003-297100 A | 10/2003 |
| JP | 2006-079678 A | 3/2006 |
| KR | 10-2007-0111563 A | 11/2007 |
| KR | 10-1034036 B1 | 5/2011 |

\* cited by examiner

*Primary Examiner* — Nicholas J Simonetti
(74) *Attorney, Agent, or Firm* — Lee IP Law, P.C.

(57) ABSTRACT

A semiconductor memory device includes a test pattern data storage configured to store test write pattern data in response to a register write command and a register address and output test read pattern data in response to a test read command and a test pattern data selection signal during a test operation, a memory cell array including a plurality of memory cells and configured to generate read data, a read path unit configured to generate n read data, by serializing the read data, and a test read data generation unit configured to generate n test read data, by comparing the test read pattern data with each of the n read data, generated at a first data rate, and generate the n test read data, at a second data rate lower than the first data rate, during the test operation.

20 Claims, 11 Drawing Sheets

FIG. 4

| COM | | TCK EDGE | TCA9 | TCA8 | TCA7 | TCA6 | TCA5 | TCA4 | TCA3 | TCA2 | TCA1 | TCA0 | TCAB1 | TRESET | TCKE |
|---|---|---|---|---|---|---|---|---|---|---|---|---|---|---|---|
| MRS | | R | H | L | | | I | | | | | | X | X | X |
| | | F | H | L | | | | | | | | | X | X | X |
| REGWR | | R | H | H | H | | | | III | | II | | X | X | X |
| | | F | H | L | | | | | | | | | X | X | X |
| TACT | | R | L | L | L | L | IV | X | X | V | X | X | X | X | X |
| | | F | | | | | | | | | | | X | X | X |
| TWR | | R | H | H | L | L | IV | | | VI | | | X | X | X |
| | | F | L | L | L | L | V | | | | | | X | X | X |
| TRD | | R | H | H | L | L | IV | | | VI | | | X | X | X |
| | | F | L | H | L | L | OTFPS | | OTFPS | | | | OTFPS | OTFPS | OTFPS |

# SEMICONDUCTOR MEMORY DEVICE AND TEST SYSTEM INCLUDING THE SAME

CROSS-REFERENCE TO THE RELATED APPLICATION

Korean Patent Application No. 10-2020-0174328, filed on Dec. 14, 2020 in the Korean Intellectual Property Office, and entitled: "Semiconductor Memory Device and Test System Including the Same," is incorporated by reference herein in its entirety.

BACKGROUND

1. Field

Embodiments relate to a semiconductor memory device and a test system including the same.

2. Description of the Related Art

Once a semiconductor memory device is manufactured, a manufacturer may perform a test, e.g., a parallel bit test, using a test apparatus to test whether the semiconductor memory device operates normally.

SUMMARY

Embodiments are directed to a semiconductor memory device, including: a test pattern data storage configured to store test write pattern data having a first predetermined number of bits in response to a register write command and a register address and output test read pattern data having the first predetermined number of bits in response to a test read command and a test pattern data selection signal, during a test operation, a row decoder configured to generate a plurality of word line selection signals by decoding a row address, a column decoder configured to generate a plurality of column selection signals by decoding a column address, a memory cell array including a plurality of memory cells and configured to generate read data having a plurality of bits from memory cells selected by one of the plurality of word line selection signals and one of the plurality of column selection signals, a read path unit configured to generate n read data, each having the first predetermined number of bits by serializing the read data having the plurality of bits, and a test read data generation unit configured to generate n test read data, each having a third predetermined number of bits, by comparing the test read pattern data having the first predetermined number of bits with each of the n read data, having the first predetermined number of bits generated at a first data rate, by the second predetermined number of bits, and generate the n test read data, each having the third predetermined number of bits at a second data rate lower than the first data rate, during the test operation.

Embodiments are also directed to a semiconductor memory, including: a command and address generator configured to generate a register address together with a register write command, generate a row address together with a test active command, or generate a column address together with a test write command by receiving and decoding a test command/address in response to a test clock signal, or to generate the column address and a test pattern data selection signal together with a test read command by receiving and decoding the test command/address and a special-purpose signal in response to the test clock signal, during a test operation, a test pattern data storage configured to store test write pattern data having a first predetermined number of bits in response to the register write command and the register address and output test read pattern data having the first predetermined number of bits in response to the test read command and the test pattern data selection signal, during the test operation, a row decoder configured to generate a plurality of word line selection signals by decoding the row address, a column decoder configured to generate a plurality of column selection signals by decoding the column address, a memory cell array including a plurality of memory cells and configured to store write data having a plurality of bits in memory cells selected by one of the plurality of word line selection signals and one of the plurality of column selection signals or generate read data having a plurality of bits from the selected memory cells, a test write data generation unit configured to copy, or invert and copy each of n test write data, having a second predetermined number of bits applied at the first data rate in response to a test write clock signal, and generate n write data, each having the first predetermined number of bits at a second data rate higher than the first data rate, during the test operation, a write path unit configured to generate write data having a plurality of bits by parallelizing the n write data, each having the first predetermined number of bits, a read path unit configured to generate n read data each having the first predetermined number of bits by serializing the read data having the plurality of bits, and a test read data generation unit configured to generate n test read data, each having a fourth predetermined number of bits, by comparing the test read pattern data having the first predetermined number of bits with each of the n read data, having the first predetermined number of bits generated at the first data rate, a third predetermined number of bits by the third predetermined number of bits, and generate the n test read data each having the fourth predetermined number of bits at a third data rate lower than the first data rate, during the test operation.

Embodiments are also directed to a test system, including: a test apparatus configured to apply a test command/address in response to a test clock signal, transmit test data or test write pattern data having a first predetermined number of bits in response to a test write clock signal, and receive the test data, and a semiconductor memory device including a test pattern data storage configured to store test write pattern data having the first predetermined number of bits in response to a register address, when the test command/address is a register write command and the register address, and output test read pattern data having the first predetermined number of bits in response to a test pattern data selection signal, when the test command/address is a test read command and the test pattern data selection signal, during a test operation, a row decoder configured to generate a plurality of word line selection signals by decoding a row address, a column decoder configured to generate a plurality of column selection signals by decoding a column address, a memory cell array including a plurality of memory cells and configured to generate read data having a plurality of bits from memory cells selected by one of the plurality of word line selection signals and one of the plurality of column selection signals, a read path unit configured to generate n read data, each having the first predetermined number of bits by serializing the read data having the plurality of bits, and a test read data generation unit configured to generate n test read data, each having a third predetermined number of bits, by comparing the test read pattern data having the first predetermined number of bits with each of the n read data, having the first predetermined number of bits generated at a first data rate, by the second predetermined number of bits, and generate the n test read data each having the third predetermined number of bits at a second data rate lower than the first data rate, during the test operation.

BRIEF DESCRIPTION OF THE DRAWINGS

Features will become apparent to those of skill in the art by describing in detail example embodiments with reference to the attached drawings in which:

FIG. 4 is a diagram illustrating a truth table for commands and addresses applied from a test apparatus according to an example embodiment.

DETAILED DESCRIPTION

Figure 1:
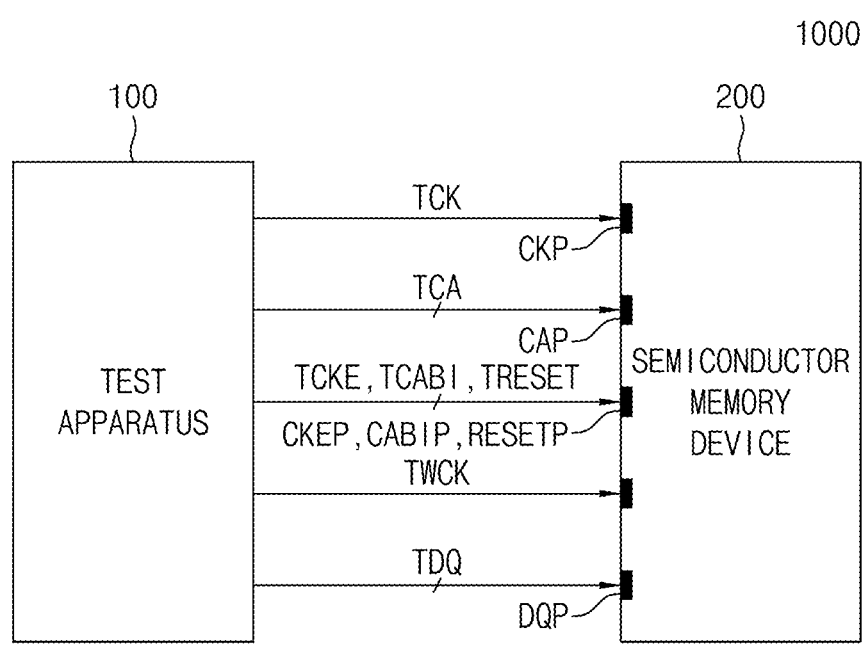
FIG. 1 is a block diagram illustrating a test system according to an example embodiment.

FIG. 1 is a block diagram illustrating a test system according to an example embodiment.

Referring to FIG. 1, a test system 1000 may include a test apparatus 100 and a semiconductor memory device 200.

The test apparatus 100 may transmit, to the semiconductor memory device 200, a test clock signal TCK, a test command/address TCA, a test clock enable signal TCKE, a test command/address bus inversion signal TCABI, and a test reset signal TRESET, and may transmit and receive test data TDQ.

The semiconductor memory device 200 may receive the test clock signal TCK, the test command/address TCA, the test clock enable signal TCKE, the test command/address bus inversion signal TCABI, and the test reset signal TRESET, and may transmit and receive test data TDQ.

The test clock signal TCK may be applied through a clock signal terminal CKP. The test command/address TCA may be applied through a command/address terminal CAP. The test clock enable signal TCKE may be applied through a clock enable terminal CKEP. The test command/address bus inversion signal TCABI may be applied through a command/address bus inversion signal terminal CABIP. The test reset signal TRESET may be applied through a reset signal terminal RESETP. The test data TDQ may be input and output through a data terminal DQP.

The test apparatus 100 may apply the test command/address TCA at rising and falling edges of the test clock signal TCK, may transmit the test data TDQ at a first data rate (e.g., a single data rate (SDR)) in response to the rising edge of a test write clock signal TWCK during a test write operation, and may receive the test data TDQ transmitted at a second data rate equal to or lower than the first data rate during a test read operation.

The semiconductor memory device 200 may be a semiconductor memory device operating at a third data rate (e.g., a double data rate (DDR)) during a normal operation, and may be, e.g., a DDR, low-power DDR (LPDDR), or graphic DDR (GDDR) device.

The semiconductor memory device 200 may receive the test data TDQ input at the first data rate and may internally generate test write data at a third data rate higher than the first data rate, during the test write operation.

The semiconductor memory device 200 may generate test read data by comparing internally pre-stored test pattern data with read data generated internally at the third data rate, and generate the test read data as the test data TDQ at the second data rate, during the test read operation.

The test clock enable signal TCKE, the test command/address bus inversion signal TCABI, and the test reset signal TRESET may be used as a test pattern data selection signal during the test read operation. During the normal operation, however, the clock enable signal CKE (applied through the clock enable signal terminal CKEP) may be used to deactivate an internal clock signal (not shown), a data input unit (not shown), and a data output unit (not shown) in the semiconductor memory device 200, a command/address bus inversion signal CABI (applied through the command/address bus inversion signal terminal CABIP) may be used to invert a command/address bus, and the reset signal RESET (applied through the reset signal terminal RESETP) may be used to reset the semiconductor memory device 200. That is, the test clock enable signal TCKE, the test command/address bus inversion signal TCABI, and the test reset signal TRESET may be special-purpose signals used for a special purpose during the normal operation.

When the test clock enable signal TCKE, the test command/address bus inversion signal TCABI, and the test reset signal TRESET are at a "low" level, this may indicate that the signals are activated. When the test clock enable signal TCKE, the test command/address bus inversion signal TCABI, and the test reset signal TRESET are at a "high" level, this may indicate that the signals are deactivated.

Figure 2A:
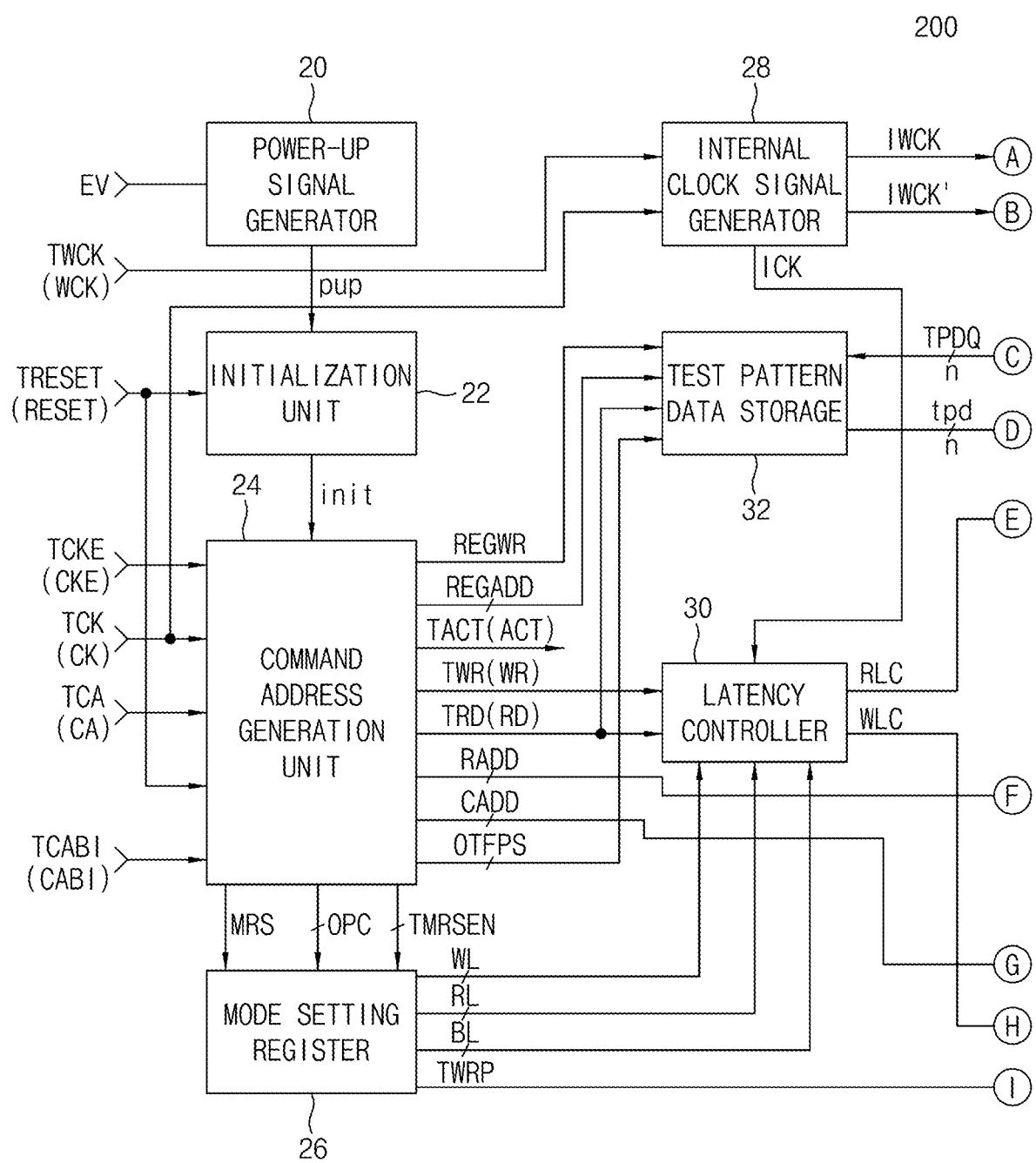
FIGS. 2A and 2B are block diagrams illustrating a semiconductor memory device according to an example embodiment.
Figure 2B:
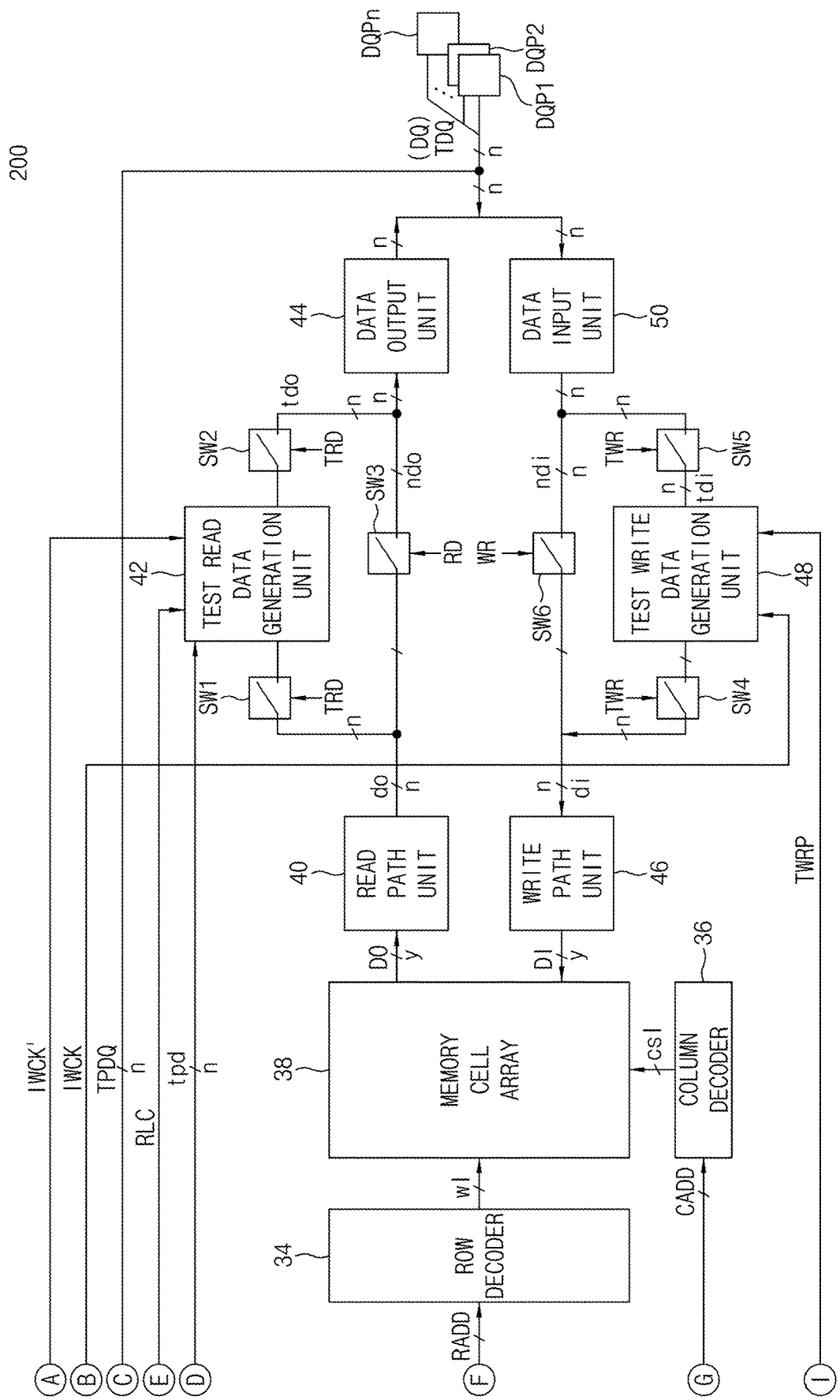

FIGS. 2A and 2B are block diagrams illustrating a semiconductor memory device according to an example embodiment.

Referring to FIGS. 2A and 2B, a semiconductor memory device 200 may include a power-up signal generator 20, an initialization unit 22, a command and address generation unit 24, a mode setting register 26, an internal clock signal generator 28, a latency controller 30, a test pattern data storage 32, a row decoder 34, a column decoder 36, a memory cell array 38, a read path unit 40, a test read data generation unit 42, a data output unit 44, a write path unit 46, a test write data generation unit 48, a data input unit 50, and first to sixth switches SW1 to SW6.

The functions of the blocks illustrated in FIGS. 2A and 2B will be described below.

The power-up signal generator 20 may detect a level of a memory voltage EV, and generate a power-up signal pup when the memory voltage EV reaches a target voltage level.

The initialization unit 22 may generate an initialization signal init in response to the power-up signal pup and the test reset signal TRESET or the reset signal RESET during the test operation or the normal operation.

The command and address generation unit 24 may generate a mode setting code OPC together with a mode setting command MRS by decoding the test command/address TCA in response to the test clock signal TCK. The mode setting code OPC may include information related to a test mode enable signal TMRSEN, a test write pattern control signal TWRP, a write latency WL, a read latency RL, and/or a burst length BL.

When the test mode enable signal TMRSEN is activated or when both of the test mode enable signal TMRSEN and the initialization signal init are activated, the command and address generation unit 24 may generate a register address REGADD together with a register write command REGWR by decoding the test command/address TCA in response to the test clock signal TCK.

Further, when the test mode enable signal TMRSEN is activated, the command and address generation unit 24 may decode the test command/address TCA applied in response to the test clock signal TCK to generate a test active command TACT and a row address RADD and generate a test write command TWR and a column address CADD.

Further, when the test mode enable signal TMRSEN is activated, the command and address generation unit 24 may generate a test read command TRD, the column address CADD, and a test pattern data selection signal OTFPS using the test command/address TCA, the test clock enable signal TCKE, the test command/address inversion signal TCABI, and the test reset signal TRESET applied in response to the test clock signal TCK.

During the normal operation, the command and address generation unit 24 may decode a command and address CA in response to a clock signal CK and the clock enable signal CKE to generate a row address RADD together with an active command ACT, generate a column address CADD together with a write command WR or a read command RD, and generate the mode setting code OPC together with the mode setting command MRS.

The mode setting register 26 may set the write latency WL, the read latency RL, the burst length BL, the test mode enable signal TMRSEN, and the test write pattern control signal TWRP by the mode setting code OPC applied together with the mode setting command MRS.

During the test operation, the internal clock signal generator 28 may receive the test clock signal TCK and the test write clock signal TWCK and generate an internal clock signal ICK and internal write clock signals IWCK and IWCK'. During the normal operation, the internal clock signal generator 28 may receive the clock signal CK and the write clock signal WCK and generate the internal clock signal ICK and the internal write clock signal IWCK.

During the test operation or the normal operation, the latency controller 30 may generate a write latency signal WLC (which is activated after being delayed by a cycle corresponding to the write latency WL and deactivated after being delayed by a cycle corresponding to the burst length BL) in response to the test write command TWR or the write command WR, and the internal clock signal ICK, and may generate a read latency signal RLC (which is activated after being delayed by a cycle corresponding to the read latency RL and deactivated after being delayed by a cycle corresponding to the burst length BL) in response to the test read command TRD or the read command RD, and the internal clock signal ICK.

The test pattern data storage 32 may include a plurality of registers (not shown). During the test operation, the test pattern data storage 32 may store test write pattern data TPDQ in one selected among the plurality of registers in response to the register write command REGWR and the register address REGADD, and output test read pattern data tpd from one selected among the plurality of registers in response to the test read command TRD and the test pattern data selection signal OTFPS.

During the test operation or the normal operation, the row decoder 34 may generate a plurality of word line selection signals wl by decoding the row address RADD.

During the test operation or the normal operation, the column decoder 36 may generate a plurality of column selection signals csl by decoding the column address CADD.

The memory cell array 38 may include a plurality of memory cells (not shown). The memory cell array 38 may store write data DI to, or output read data DO from, memory cells selected among the plurality of memory cells by the plurality of word line selection signals wl and the plurality of column selection signals csl. For example, each of the write data DI and the read data DO may be y-bit data, and y bits may be 256 bits.

During a test read operation and a normal read operation, the read path unit 40 may generate a number n of m-bit read data do (which may be referred to herein as n read data) by serializing the read data DO. For example, the read path unit 40 may sequentially generate 16 16-bit read data do by 1 bit at the DDR by serializing 256-bit read data DO.

When the first switch SW1 is turned on in response to the test read command TRD, the test read data generation unit 42 may generate n (m/1)-bit test read data tdo (which may be referred to herein as n test read data) by comparing each of the n m-bit read data do with m-bit test read pattern data tpd by (m/1) bits, and serialize each of the n (m/1)-bit test read data tdo by 1 bit at the second data rate in response to the read latency signal RLC and the internal test write clock signal IWCK'. For example, the test read data generation unit 42 may generate 16 8-bit, 4-bit, 2-bit, or 1-bit test read data tdo by comparing each of 16 16-bit read data do with 16-bit test read pattern data tpd by 2 bits, by 4 bits, by 8 bits, or by 16 bits, and sequentially serialize each of the 16 8-bit, 4-bit, 2-bit, or 1-bit test read data tdo by 1 bit.

When the second switch SW2 is turned on in response to the test read command TRD, the data output unit 44 may drive each of the n (m/1)-bit test read data tdo by 1 bit at the second data rate to generate n test data TDQ. When the third switch SW3 is turned on in response to the read command RD, the data output unit 44 may drive each of n m-bit normal read data ndo by 1 bit at the third data rate to generate n data DQ. For example, the data output unit 44 may generate 16 8-bit, 4-bit, 2-bit, or 1-bit test data TDQ by sequentially driving each of 16 8-bit, 4-bit, 2-bit, or 1-bit read data tdo by 1 bit at the second data rate during the test read operation, whereas the data output unit 44 may generate 16 16-bit data DQ by sequentially driving each of 16 16-bit normal read data ndo by 1 bit at the third data rate during the normal read operation.

During a test write operation and a normal write operation, the write path unit 46 may generate the y-bit write data DI by parallelizing n m-bit write data di. For example, the write path unit 46 may generate 256-bit write data DI by parallelizing 16 16-bit write data di.

During the test write operation, when the fourth and fifth switches SW4 and SW5 are turned on, the test write data generation unit 48 may receive n x-bit test write data tdi applied at the first data rate in response to the internal write clock signal IWCK, and generate n m-bit write data di at the third data rate. For example, the test write data generation unit 48 may receive 16 8-bit, 4-bit, 2-bit, or 1-bit test write data tdi applied at the SDR in response to the rising edge of the test write clock signal TWCK to generate 16 16-bit write data di at the DDR in response to the rising and falling edges of the internal write clock signal IWCK (having the same frequency as that of the test write clock signal TWCK).

During the test write operation, when the fifth switch SW5 is switched on, the data input unit 50 may receive and buffer each of the n test data TDQ input at the second data rate by 1 bit in response to the test write clock signal TWCK, and generate the n x-bit test write data tdi. During the normal write operation, when the sixth switch SW6 is turned on, the data input unit 50 may receive and buffer each of n data TQ input at the third data rate by one bit in response to the write clock signal WCK, and generate n m-bit normal write data ndi at the third data rate.

Figure 3:
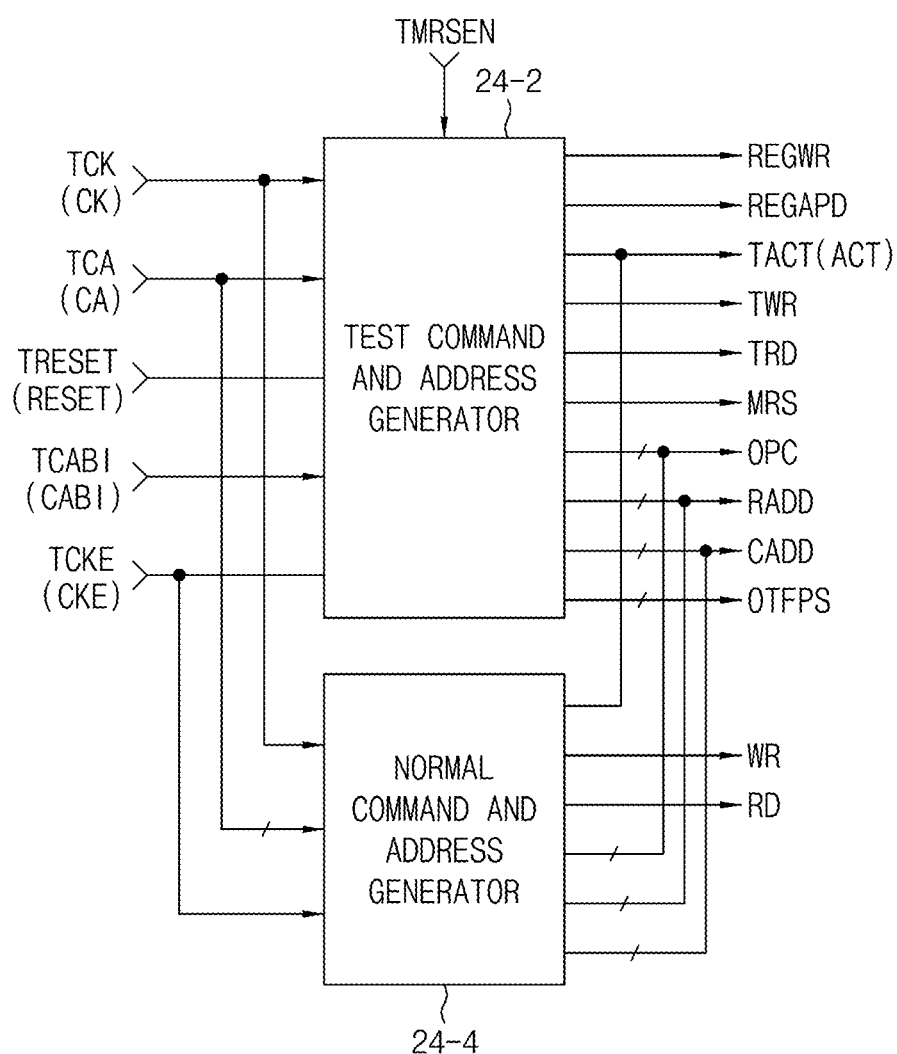
FIG. 3 is a block diagram illustrating a command and address generation unit according to an example embodiment.

FIG. 3 is a block diagram illustrating a command and address generation unit according to an example embodiment.

Referring to FIG. 3, the command and address generation unit 24 may include a test command and address generator 24-2, and a normal command and address generator 24-4.

The functions of the blocks illustrated in FIG. 3 will be described below.

When the test mode enable signal TMRSEN is activated, the test command and address generator 24-2 may decode the test command/address TCA in response to the test clock signal TCK, and may generate the register write command REGWR and the register address REGADD, generate the mode setting code OPC together with the mode setting command MRS, generate the row address RADD together with the test active command TACT, or generate the column address CADD together with the test write command TWR.

Further, when the test mode enable signal TMRSEN is activated, the test command and address generator 24-2 may generate the test read command TRD, the column address CADD, and the test pattern data election signal OTFPS using the test command/address TCA the test clock enable signal TCKE, the test command/address bus inversion signal TCABI, and the test reset signal TRESET applied in response to the test clock signal TCK.

The test pattern data selection signal OTFPS may be a predetermined number of bits of data. For example, the test pattern data selection signal OTFPS may be composed of data generated by at least one address signal unused for indicating the test read command TRD and the column address CADD in the test command/address TCA, the test clock enable signal TCKE, the test command/address bus inversion signal TCABI, and/or the test reset signal TRESET.

During the normal operation, the normal command and address generator 24-4 may decode the command and address CA in response to the clock signal CK and the clock enable signal CKE, and may generate the row address RADD together with the active command ACT, generate the column address CADD together with the write command WR or read command RD, and generate the mode setting code OPC together with the mode setting command MRS.

FIG. 4 is a diagram illustrating a truth table for commands and addresses applied from a test apparatus according to an example embodiment.

Referring to FIG. 4, when command signals TCA9 and TCA8 included in the test command/address TCA are at a "high" level H and a "low" level L, respectively at the rising edge of the test clock signal TCK and when the command signals TCA9 and TCA8 included in the test command/address TCA are at the "high" level H and the "low" level L, respectively at the falling edge of the test clock signal TCK, the mode setting command MRS may be indicated. Address signals in a hatched area I in FIG. 4 may indicate an address of the mode setting register 26, and address signals in a hatched area II in FIG. 4 may indicate the mode setting code OPC.

When both of the command signals TCA9 and TCA8 included in the test command/address TCA are at the "high" level H at the rising edge of the test clock signal TCK and when command signals TCA9, TCA8, TCA7, and TCA6 included in the test command/address TCA are at the "high" level H, the "low" level L, the "high" level H, and the "low" level L, respectively, at the falling edge of the test clock signal TCK, the register write command REGWR may be indicated. Address signals in a hatched area III in FIG. 4 may indicate a register address REGADD of the test pattern data storage 32.

Different from the illustrated case of FIG. 4, an area marked with "X" may also be used to indicate a register address REGADD of the test pattern data storage 32.

When the command signal TCA9 included in the test command/address TCA is at the "low" level L at the rising edge of the test clock signal TCK, the test active command TACT may be indicated. Address signals in a hatched area IV in FIG. 4 may indicate a bank address. Address signals in a hatched area V in FIG. 4 may indicate a row address RADD.

When both of the command signals TCA9 and TCA8 included in the test command/address TCA are at the "high" levels H at the rising edge of the test clock signal TCK and when all of the command signals TCA9 to TCA6 included in the test command/address TCA are at the "low" levels L at the falling edge of the test clock signal TCK, the test write command TWR may be indicated. Address signals in a hatched area IV in FIG. 4 may indicate a bank address. Address signals in a hatched area VI in FIG. 4 may indicate a column address CADD.

When both of the command signals TCA9 and TCA8 included in the test command/address TCA are at the "high" levels H at the rising edge of the test clock signal TCK and when the command signals TCA9, TCA8, TCA7, and TCA6 included in the test command/address TCA are at the "low" level L, the "high" level H, the "low" level L, and the "low" level L, respectively at the falling edge of the test clock signal TCK, the test read command TRD may be indicated. Address signals in a hatched area IV in FIG. 4 may indicate a bank address. Address signals in a hatched area VI in FIG. 4 may indicate a column address CADD.

Further, the test clock enable signal TCKE, the test command/address bus inversion signal TCABI, and the test reset signal TRESET which are applied at the rising edge and falling edge of the test clock signal TCK, and address signals TCA5 and TCA3 (which are not used for indicating a column address) which are applied at the falling edge of the test clock signal TCK, may indicate the test pattern data selection signal OTFPS.

Figure 5A:
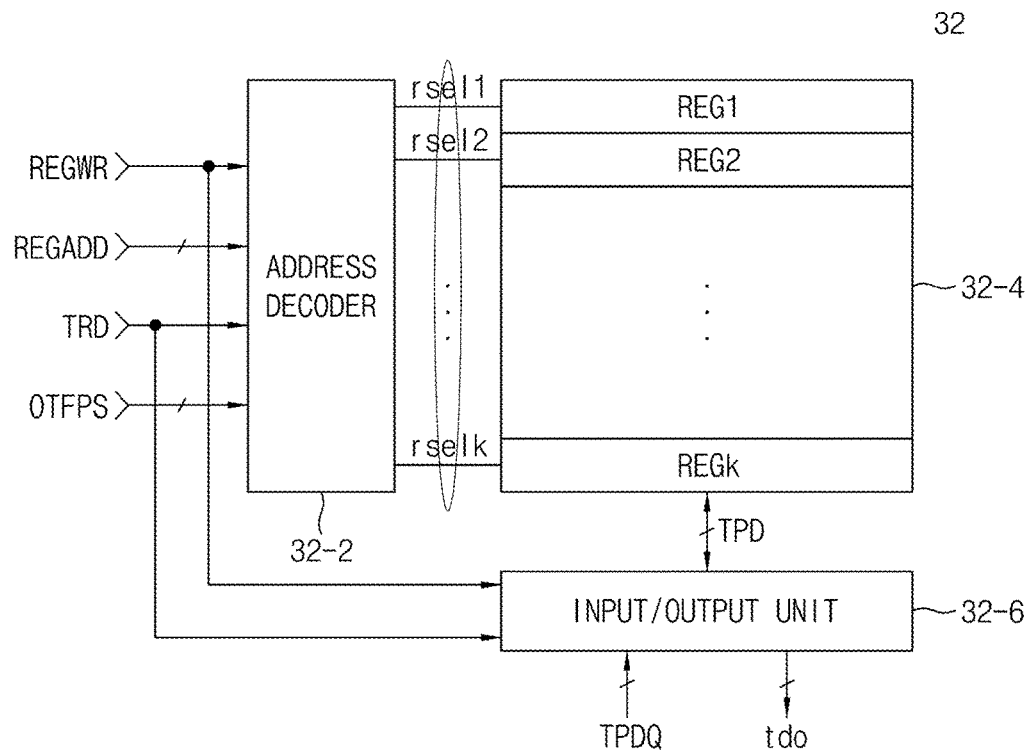
FIG. 5A is a diagram illustrating a test pattern data storage according to an example embodiment.

FIG. 5A is a diagram illustrating a test pattern data storage according to an example embodiment.

Referring to FIG. 5A, the test pattern data storage 32 may include an address decoder 32-2, a register unit 32-4, and an input/output unit 32-6.

The address decoder 32-2 may decode the register address REGADD in response to the register write command REGWR to activate one among k register selection signals rsel1 to rselk. The address decoder 32-2 may decode the test pattern data selection signal OTFPS in response to the read command TRD to activate one among the k register selection signals rsel1 to rselk.

The register unit 32-4 may include k registers REG1 to REGk. The k registers REG1 to REGk may store or output m-bit test pattern data TPD in response to the k selection signals rsel1 to rselk.

The input/output unit 32-6 may output m-bit test write pattern data TPDQ as the m-bit test pattern data TPD in response to the register write command REGWR. The input/output unit 32-6 may output the m-bit test pattern data TPD as m-bit test read pattern data tdo in response to the test read command TRD.

Figure 5B:
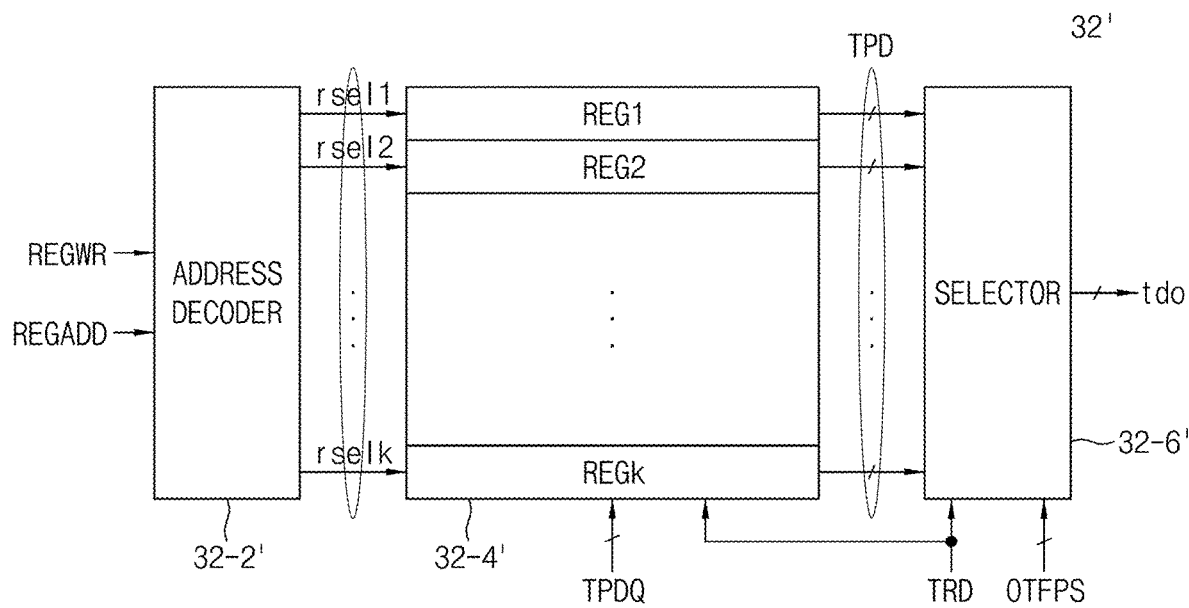
FIG. 5B is a diagram illustrating a test pattern data storage according to an example embodiment.

FIG. 5B is a diagram illustrating a test pattern data storage according to an example embodiment.

Referring to FIG. 5B, a test pattern data storage 32' may include an address decoder 32-2', a register unit 32-4', and a selector 32-6'.

The address decoder 32-2' may activate one among k register selection signals rsel1 to rselk by decoding the register address REGADD in response to the register write command REGWR.

The register unit 32-4' may include k registers REG1 to REGk. The k registers REG1 to REGk may store m-bit test pattern data TPD in response to the k selection signals rsel1 to rselk, and output k m-bit test pattern data TPD in response to the test read command TRD.

The selector 32-6' may select one among the k m-bit test pattern data TPD in response to the test read command TRD and the test pattern data selection signal OTFPS, and output the selected m-bit test pattern data TPD as m-bit test pattern data tdo.

Figure 6:
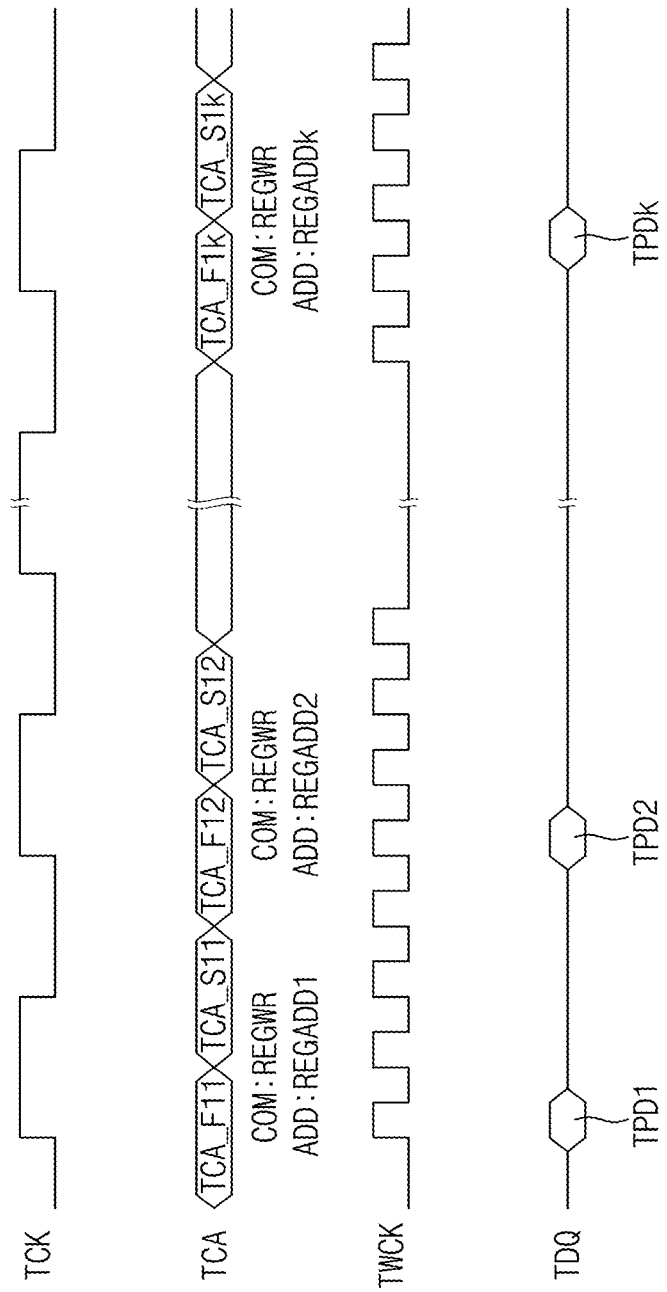
FIG. 6 is an operation timing diagram referred to for describing a register write operation according to an example embodiment.

FIG. 6 is an operation timing diagram referred to for describing a register write operation according to an example embodiment.

Referring to FIG. 6, a test command/address TCA_F11 and a test command/address TCA_S11 may be applied at the rising edge and falling edge of the clock signal CK, respectively, and m-bit test pattern data TPD1 may be applied as test write pattern data TPDQ in response to the test write clock signal TWCK. A command COM included in the test command/address TCA_F11 and the test command/address TCA_S11 may indicate the register write command REGWR. An address ADD included in the test command/address TCA_F11 and the test command/address TCA_S11 may indicate a register address REGADD1. A register selection signal rsel1 corresponding to the register address REGADD1 may be generated in response to the register write command REGWR. The test pattern data storage 32 of FIG. 5A may store the m-bit test pattern data TPD1 in the register REG1 in response to the register selection signal rsel1.

The above-described operation may be repeatedly performed, while the register address REGADD is changed from REGADD2 to REGADDk and the test pattern data TPD is changed from TPD2 to TPDk to store different (k−1) m-bit test pattern data TPD2 to TPDk in the (k−1) registers REG2 to REGk, respectively.

Figure 7:
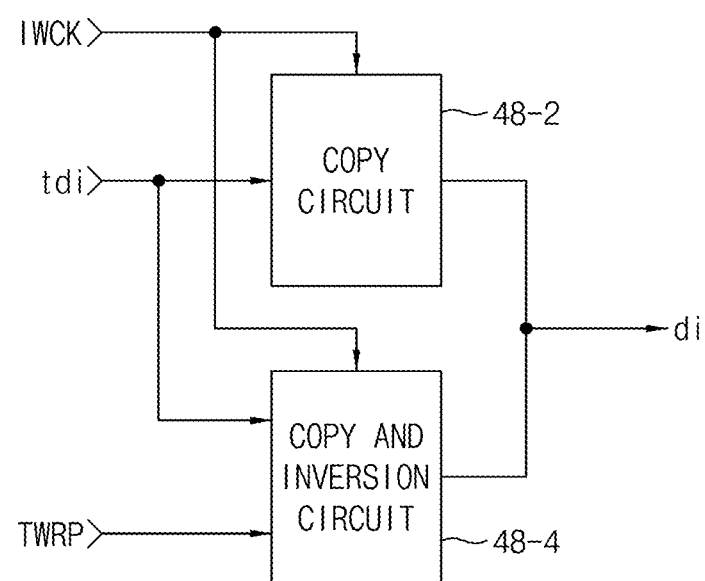
FIG. 7 is a diagram illustrating the configuration of a test write data generation unit according to an example embodiment.

FIG. 7 is a diagram illustrating the configuration of a test write data generation unit according to an example embodiment.

Referring to FIG. 7, the test write data generation unit 48 may include a copy circuit 48-2 and a copy and inversion circuit 48-4. FIG. 7 illustrates the configuration of a test write data generator corresponding to one among n data terminals DQP1 to DQPn. For example, when there are 16 data terminals, the test write data generation unit 48 may include 16 test write data generators.

The copy circuit 48-2 may transmit test write data tdi as write data di in response to the "high" level of the internal write clock signal IWCK.

The copy and inversion circuit 48-4 may transmit the test write data tdi as the write data di, or invert the test write data tdi and transmit the inverted test write data as the write data di, in response to the "low" level of the internal write clock signal IWCK.

For example, when the data write pattern control signal TWRP is at the "low" level, the copy and inversion circuit 48-4 may transmit the test write data tdi as the write data di, and when the data write pattern control signal TWRP is at the "high" level, the copy and inversion circuit 48-4 may invert the test write data tdi and transmit the inverted test write data as the write data di.

Figure 8:
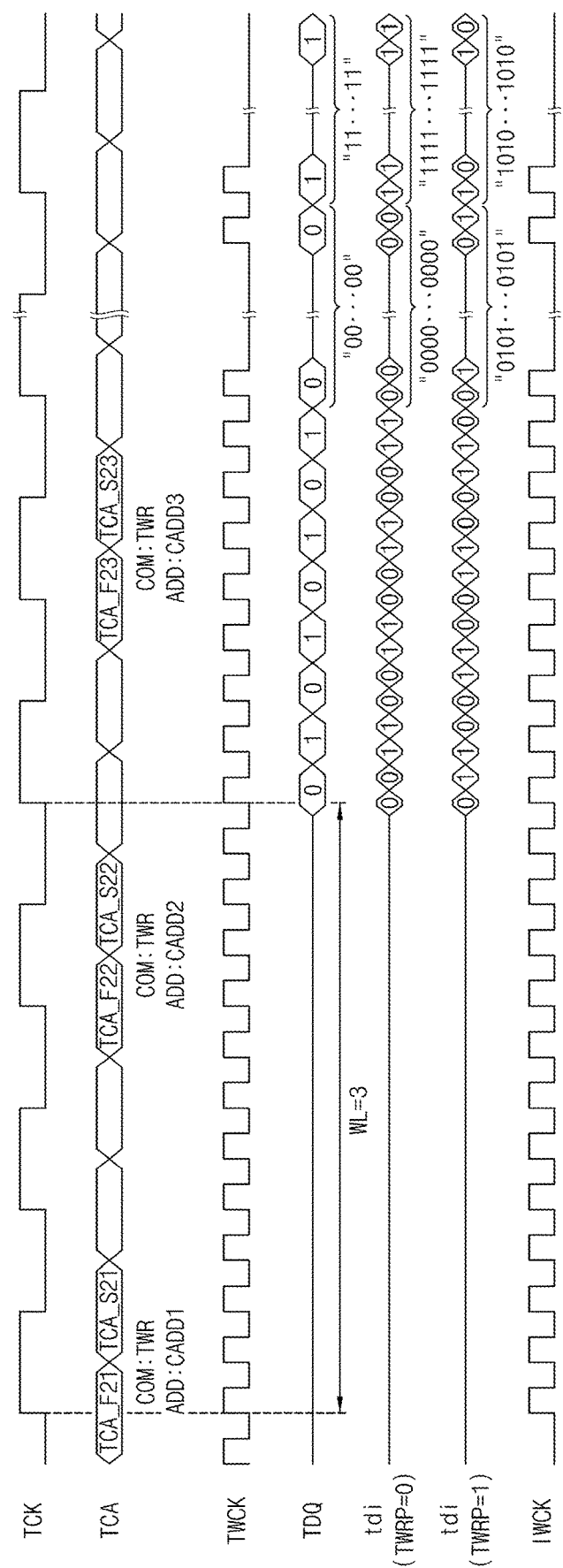
FIG. 8 is an operation timing diagram referred to for describing a test write operation according to an example embodiment.

FIG. 8 is an operation timing diagram referred to for describing a test write operation according to an example embodiment.

Before the test write operation is performed, a mode setting operation may be performed in response to the mode setting command MRS to set the test mode enable signal TMRSEN to an active state, set the write latency WL to 3 and the burst length BL to 16, and set the test write pattern control signal TWRP. Then, a row address RADD1 may be applied in response to the test active command TACT.

FIG. 8 is based on the assumption that a continuous test write operation is performed after the row address RADD1 is applied together with the test active command TACT.

Referring to FIG. 8, a test command/address TCA_F21 and a test command/address TCA_S21 may be applied in response to the rising edge and falling edge of the test clock signal TCK, respectively. A command COM included in the test command/address TCA_F21 and the test command/address TCA_S21 may indicate the test write command TWR. An address ADD included in the test command/address TCA_F21 and the test command/address TCA_S21 may include a column address CADD1.

Referring to FIGS. 2B and 8, the row decoder 34 may decode the row address RADD1 to select one word line selection signal (e.g., wl1 (not shown)) among the plurality of word line selection signals wl, and the column decoder 36 may decode the column address CADD1 to select one column selection signal (e.g., csl1 (not shown)) among the plurality of column selection signals csl. Memory cells of the memory cell array 38 may be selected by one of the plurality of word line selection signals wl and one of the plurality of column selection signals csl.

Referring to FIG. 8, test data TDQ "01010101" may be applied at the SDR in response to the test write clock signal TWCK after 3 cycles of a test clock cycle TCK from application of the test command and address TCA_F21.

Referring to FIGS. 2B and 7, when the test pattern data control signal TWRP is at the "low" level, a test write data generator of the test write data generation unit 48 may copy test write data "01010101" applied through the data input unit 50 and generate write data di "0011001100110011" at the DDR in response to the internal write clock signal IWCK (which has the same frequency as the test write clock signal TWCK). Or when the test pattern data control signal TWRP is at the "high" level, the test write data generator of the test write data generation unit 48 may copy and invert the test write data tdi "01010101" applied through the data input unit 50 and generate write data di "0110011001100110" at the DDR in response to the internal write clock signal IWCK. The test write data generation unit 48 may sequentially generate each of the 16 16-bit write data di by 1 bit. The write path unit 46 may receive the 16 16-bit write data di, parallelize the 16 16-bit write data di, and output 256-bit write data DI to selected memory cells.

Subsequently, write data DI "0000000000000000" or "0101010101010101" may be stored in memory cells selected by the row address RADD1 and a column address CADD2 by performing the above-described operation. Further, write data DI, "1111111111111111" or "1010101010101010" may then be stored in memory cells selected by the row address RADD1 and a column address CADD3.

In the above-described test write operation, even though the test data TDQ is applied at the SDR in response to the test write clock signal TWCK due to the limit of the operating speed of the test apparatus 100 illustrated in FIG. 1, the semiconductor memory device 200 may internally generate the test write data tdi at the DDR in response to the internal write clock signal IWCK.

Figure 9:
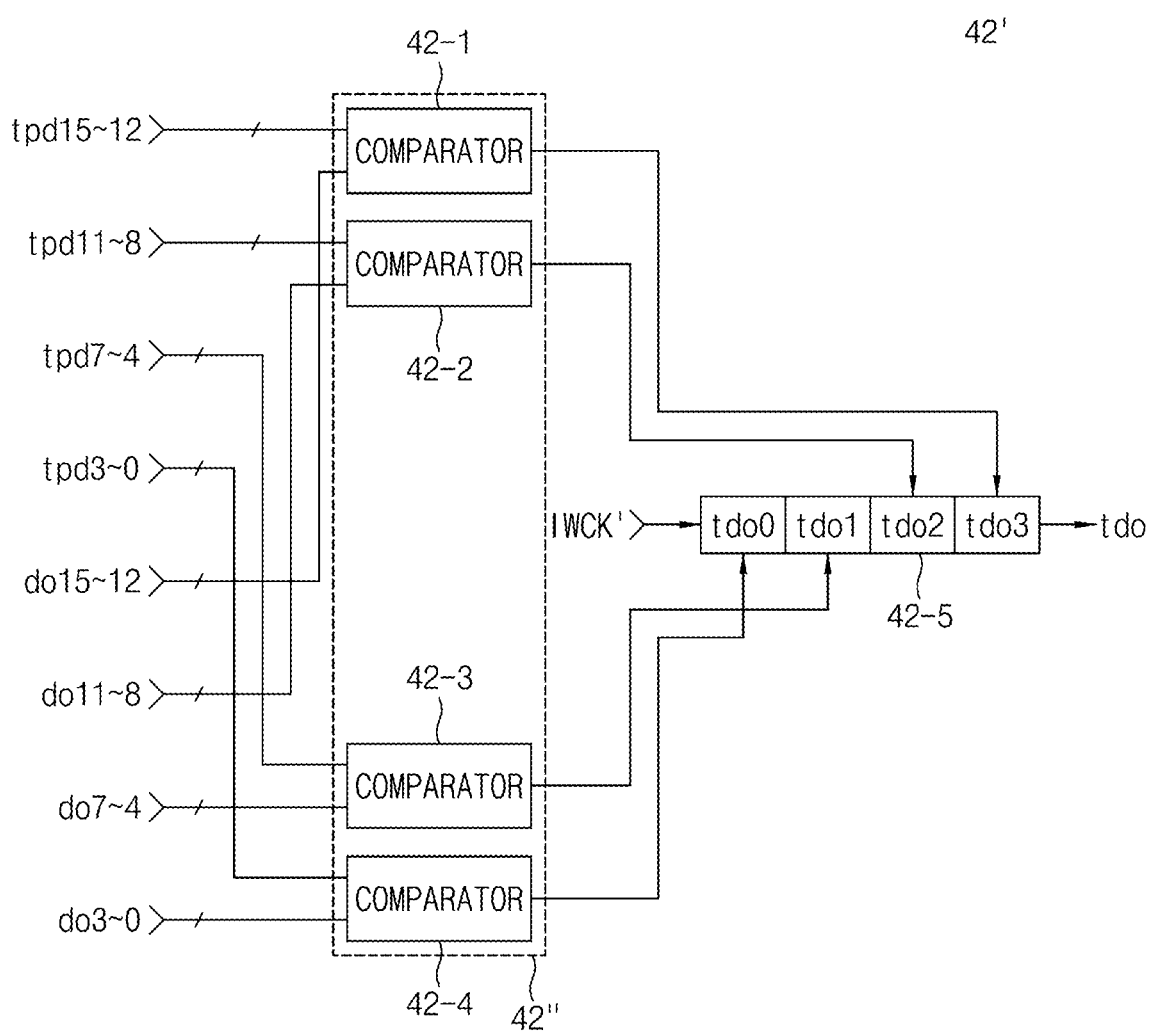
FIG. 9 is a diagram illustrating the configuration of a test read data generation unit according to an example embodiment.

FIG. 9 is a diagram illustrating the configuration of a test read data generator included in a test read data generation unit according to an example embodiment.

Referring to FIG. 9, the test read data generator 42' may include a comparison unit 42" including first to fourth comparators 42-1 to 42-4, and a register 42-5.

FIG. 9 is based on the assumption that 16-bit test read pattern data tpd is tpd15 to tpd0, and serially applied 16-bit read data tdo is do15 to do0.

FIG. 9 illustrates the configuration of a test read data generator 42' corresponding to one of the n data terminals DQP1 to DQPn. For example, when there are 16 data terminals, the test read data generation unit 42 may include 16 test read data generators 42'.

Referring to FIG. 9, the first comparator 42-1 may compare 4-bit test read pattern data tpd15 to tpd12 with 4-bit read data do15 to do12. When the 4-bit test read pattern data tpd15 to tpd12 matches the 4-bit read data do15 to do12, the first comparator 42-1 may generate data "0" and otherwise, the first comparator 42-1 may generate data "1".

The second comparator 42-2 may compare 4-bit test read pattern data tpd11 to tpd8 with 4-bit read data do11 to do8. When the 4-bit test read pattern data tpd11 to tpd8 matches the 4-bit read data do11 to do8, the second comparator 42-2 may generate data "0" and otherwise, the second comparator 42-2 may generate data "1".

Similarly, each of the third and fourth comparators 42-3 and 42-4 may generate data "0" or "1" by comparing different 4-bit data.

The register 42-5 may store the data output from the first to fourth comparators 42-1 to 42-4 as 4-bit test read data tdo3 to tdo0, and sequentially generate the test read data tdo3 to tdo0 by 1 bit in response to the internal write clock signal IWCK'. For example, the internal write clock signal IWCK' is a signal having a frequency four times lower than the frequency of the internal write clock signal IWCK, and may have the same frequency as the test clock signal CK. The test read data tdo3 to tdo0 may be generated in response to the rising edge of a clock signal having a frequency equal to or lower than the frequency of the test write clock signal TWCK.

Figure 10:
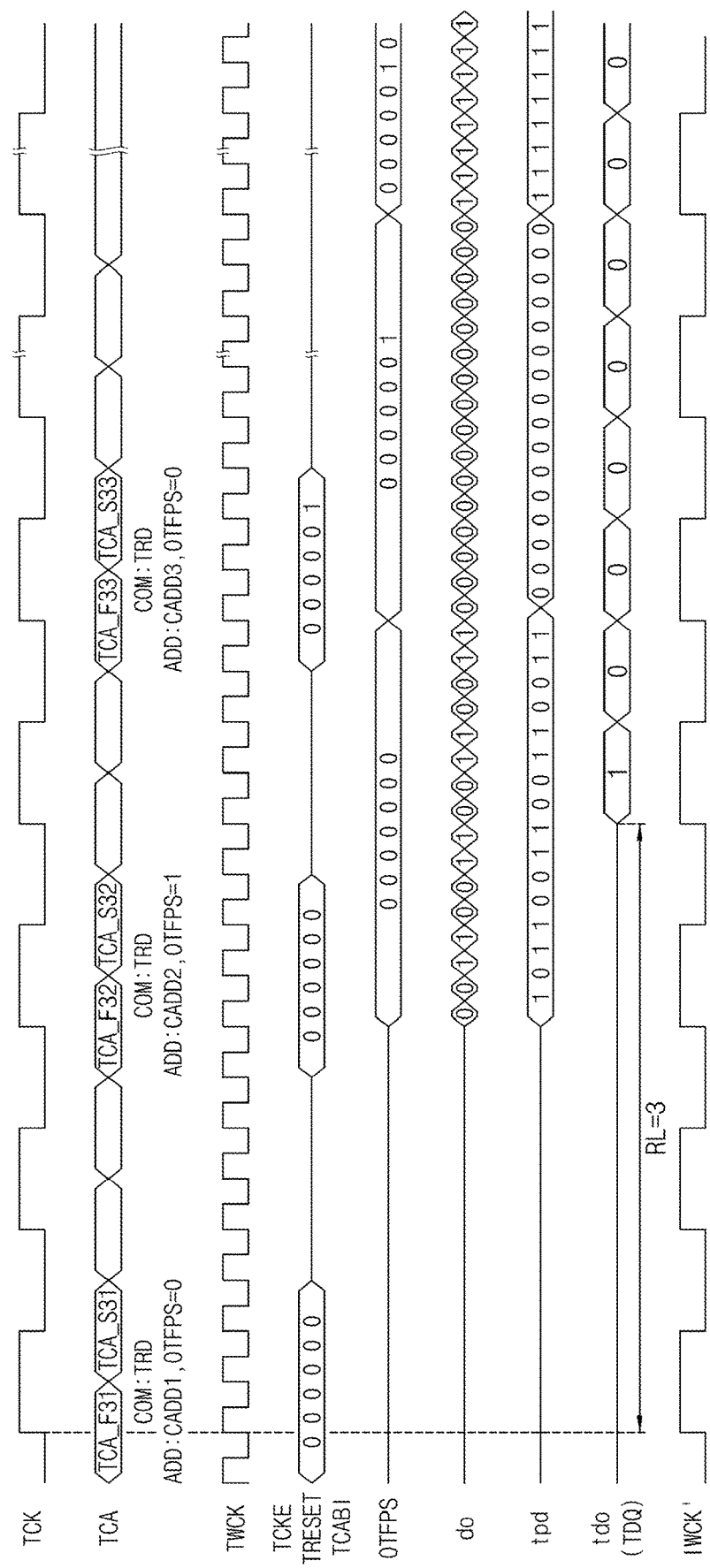
FIG. 10 is an operation timing diagram referred to for describing a test read operation according to an example embodiment.

FIG. 10 is an operation timing diagram referred to for describing a test read operation according to an example embodiment.

Before the test read operation is performed, a mode setting operation may be performed in response to the mode setting command MRS to set the test mode enable signal TMRSEN to the active state and set the read latency RL to 3 and the burst length BL to 16. Then, the row address RADD1 may be applied in response to the test active command TACT.

FIG. 10 is based on the assumption that a continuous test read operation is performed after the row address RADD1 is applied together with the test active command TACT.

Referring to FIG. 10, a test command/address TCA_F31 and a test command/address TCA_S31 may be applied in response to the rising edge and falling edge of the test clock signal TCK, respectively. Referring to FIG. 4, a command COM included in the test command/address TCA_F31 and the test command/address TCA_S31 may indicate the test read command TRD, and an address ADD included in the test command/address TCA_F31 and the test command/address TCA_S31 may include the column address CADD1.

Referring to FIGS. 2B and 10, the row decoder 34 may decode the row address RADD1 to select one word line selection signal (e.g., wl1 (not shown)) among the plurality of word line selection signals wl, and the column decoder 36 may decode the column address CADD1 to select one column selection signal (e.g., csl1 (not shown)) among the plurality of column selection signals csl. Memory cells of the memory cell array 38 may be selected by one among the plurality of word line selection signals wl and one among the plurality of column selection signals csl, and generate y-bit read data do. The read path unit 40 may generate n m-bit read data do "1011001100110011" by serializing the y-bit read data do.

Referring to FIGS. 4 and 10, the address included in the test command/address TCA_F31 and the test command/address TCA_S31 may indicate a part (e.g., least significant bit (LSB)) set to "0" of the test pattern data selection signal OTFPS, and the test clock enable signal TCKE, the test reset signal TRESET, and the test command/address bus inversion signal TCABI may indicate the remaining part (e.g., upper 6 bits) set to "000000" of the test pattern data selection signal OTFPS. That is, the test pattern data selection signal OTFPS may be "0000000".

Referring to FIGS. 2A, 5A, 5B, and 9, the test pattern data storage 32 may output test pattern data TPD1 "0011001100110011" stored in the register REG1 of the register unit 32-4 or 32-4' as test read pattern data tpd in response to the test pattern data selection signal OTFPS. A test read data generator of the test read data generation unit 42 may compare 16-bit read data do "1011001100110011" with 16-bit test read pattern data tpd "0011001100110011" by 4 bits, and sequentially generate 4-bit test read data tdo "1000" by 1 bit in response to the internal write clock signal IWCK'. When the 16-bit read data do fully matches the 16-bit test read pattern data tpd, 4-bit test read data tdo "0000" may be generated. The data output unit 44 may serially generate each of the n 4-bit test read data tdo as the test data TDQ by 1 bit.

While it has been described in the above example embodiment the test read data generator of the test read data generation unit 42 generates 4-bit test read data tdo in serial, the test read data generator may be configured to include two comparators and thus generate 8-bit test read data tdo in serial, to include eight comparators and thus generate 2-bit test read data tdo in serial, or to include 16 comparators and thus generate 1-bit test read data tdo.

In the above-described test read operation, the semiconductor memory device 200 may internally compare m-bit test pattern data with m-bit read data, (m/k) bits by (m/k) bits in advance, generate test read data of one bit fewer than m bits, and transmit the test read data to the test apparatus 100. Thus, the semiconductor memory device 200 may transmit the test data TDQ at a data rate equal to or lower than the SDR to the test apparatus 100. Accordingly, a test time may not be increased despite a limited operating speed of the test apparatus 100.

By way of summation and review, a test apparatus may perform a test operation at an operating speed that is the same as an operating speed at which the semiconductor memory device performs a normal operation with a control unit (e.g., a central processing unit (CPU) or a graphic processing unit (GPU)) in an actual memory system. However, compared to the ever-increasing operating speed of the semiconductor memory device, the operating speed of the test apparatus has not been correspondingly increased, and thus the operating speed of the semiconductor memory device is ahead of that of the test apparatus. For example, while the semiconductor memory device may be capable of transmitting and receiving data at a rate of 16 giga bits (GB) per second, the test apparatus may only be capable of transmitting and receiving data at a rate of 8 GB per second. Accordingly, a longer time is taken to test the semiconductor memory device.

As described above, embodiments may provide a semiconductor memory device that reduces test time, and a test system including the same.

According to an example embodiment, even when the operation speed of a test apparatus is lower than that of a semiconductor memory device, the semiconductor memory device may internally generate test read data by comparing test pattern data with read data generated at a first data rate, and output the test read data at a second data rate lower than the first data rate. Therefore, a test time may not be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
  a test pattern data storage, the test pattern data storage being configured to, during a test operation:
    store test write pattern data in response to a register write command and a register address, wherein each of the test write pattern data has a first predetermined number of bits, and
    output test read pattern data in response to a test read command and a test pattern data selection signal, wherein each of the test read pattern data has the first predetermined number of bits;
  a row decoder, which generates a word line selection signal by decoding a row address;
  a column decoder, which generates a column selection signal by decoding a column address;
  a memory cell array, which outputs data from memory cells selected by the word line selection signal and the column selection signal;
  a read path unit, the read path unit being configured to generate a number n of read data at a first data rate by serializing the data from the memory cell array, wherein each of the n read data has the first predetermined number of bits; and
  a test read data generation unit, the test read data generation unit being configured to, during the test operation:
    generate n test read data by comparing the test read pattern data with each of the n read data, wherein each of the n test read data has a third predetermined number of bits, and wherein the comparing is performed on a basis of a second predetermined number of bits, and
    generate the n test read data at a second data rate, wherein the second data rate is lower than the first data rate.

2. The semiconductor memory device as claimed in claim 1, further comprising a command and address generator, the command and address generator being configured to, during the test operation:
  generate the register address together with the register write command, generate the row address together with a test active command, or generate the column address together with a test write command by receiving and decoding a test command/address in response to a test clock signal, or
  generate the column address and the test pattern data selection signal together with the test read command by receiving and decoding the test command/address and a special-purpose signal in response to the test clock signal.

3. The semiconductor memory device as claimed in claim 2, wherein the test pattern data selection signal is generated using an address that is not used for indicating the column address among address signals included in the test command/address, and using the special-purpose signal.

4. The semiconductor memory device as claimed in claim 3, wherein the special-purpose signal includes at least one of a clock enable signal, a command and address bus inversion signal, and a reset signal, which is used for a special purpose during a normal operation.

5. The semiconductor memory device as claimed in claim 2, wherein the test pattern data storage includes a register unit, the register unit including a plurality of registers,
  wherein the test pattern data storage is configured to store test pattern data in, or output test pattern data from, one of the plurality of registers in response to the register address or the test pattern data selection signal, and
  wherein the test pattern data storage is further configured to:
    transmit the test write pattern data as the test pattern data in response to the register write command and the register address, and
    transmit the test pattern data as the test read pattern data in response to the test read command and the test pattern data selection signal.

6. The semiconductor memory device as claimed in claim 2, wherein the test read data generation unit includes n test read data generators, and
  wherein each of the n test read data generators includes a comparison unit configured to generate the test read data by comparing the test read pattern data with the read data, and wherein the comparing is performed on a basis of the second predetermined number of bits.

7. The semiconductor memory device as claimed in claim 6, further comprising a test write data generation unit, the test write data generation unit being configured to:
copy, or invert and copy, each of n test write data at a third data rate, each of the test write data having a fourth predetermined number of bits, and
generate n write data at the first data rate, each of the write data having the first predetermined number of bits,
wherein the first data rate is higher than the third data rate, and the second data rate is equal to or lower than the third data rate.

8. The semiconductor memory device as claimed in claim 7, wherein the test command/address is applied in response to rising and falling edges of the test clock signal,
wherein each of then test write data is applied in response to a rising edge of a test write clock signal having a higher frequency than the test clock signal, and
wherein each of then test read data is generated in response to a rising edge of a clock signal having a frequency equal to or lower than the frequency of the test write clock signal.

9. A semiconductor memory device, comprising:
a command and address generator, the command and address generator being configured to, during a test operation:
generate a register address together with a register write command, generate a row address together with a test active command, or generate a column address together with a test write command by receiving and decoding a test command/address in response to a test clock signal, or
generate the column address and a test pattern data selection signal together with a test read command by receiving and decoding the test command/address and a special-purpose signal in response to the test clock signal;
a test pattern data storage, the test pattern data storage being configured to, during the test operation:
store test write pattern data in response to the register write command and the register address, wherein each test write pattern data has a first predetermined number of bits, and
output test read pattern data in response to the test read command and the test pattern data selection signal, wherein each test read pattern data has the first predetermined number of bits;
a row decoder, which generates a word line selection signal by decoding the row address;
a column decoder, which generates a column selection signal by decoding the column address;
a memory cell array, which outputs data from memory cells selected by the word line selection signal and the column selection signal;
a test write data generation unit, the test write data generation unit being configured to, during the test operation:
copy, or invert and copy, a number n of test write data at a first data rate in response to a test write clock signal, wherein each of the test write data has a second predetermined number of bits, and
generate n write data at a second data rate, wherein the second data rate is higher than the first data rate, and wherein each of the write data has the first predetermined number of bits;
a write path unit, the write path unit being configured to parallelize the n write data;
a read path unit, the read path unit being configured to serialize the data output from the memory cell array to generate n read data, wherein each of the n read data has the first predetermined number of bits; and
a test read data generation unit, the test read data generation unit being configured to, during the test operation:
generate n test read data by comparing the test read pattern data with each of the n read data at the first data rate, wherein the comparing is performed on a basis of a third predetermined number of bits, and wherein each of the n test read data has a fourth predetermined number of bits, and
generate the n test read data at a third data rate, wherein the third data rate is lower than the first data rate.

10. The semiconductor memory device as claimed in claim 9, wherein the test pattern data selection signal is generated using an address that is not used for indicating the column address among address signals included in the test command/address, and using the special-purpose signal.

11. The semiconductor memory device as claimed in claim 10, wherein the special-purpose signal includes at least one of a clock enable signal, a command and address bus inversion signal, and a reset signal, which is used for a special purpose during a normal operation.

12. The semiconductor memory device as claimed in claim 9, wherein the test read data generation unit includes n test read data generators, and
wherein each of the n test read data generators includes a comparison unit configured to generate the test read data by comparing the test read pattern data with the read data, and wherein the comparing is performed on a basis of the third predetermined number of bits.

13. The semiconductor memory device as claimed in claim 12, wherein the test command/address is applied in response to rising and falling edges of the test clock signal,
wherein each of the n test write data is applied at a rising edge of the test write clock signal, and
wherein each of the n test read data is generated in response to a rising edge of a clock signal having a frequency equal to or lower than a frequency of the test write clock signal.

14. A test system, comprising:
a test apparatus, the test apparatus being configured to:
apply a test command/address in response to a test clock signal,
transmit test data or test write pattern data having a first predetermined number of bits in response to a test write clock signal, and
receive the test data; and
a semiconductor memory device, the semiconductor memory device including:
a test pattern data storage, the test pattern data storage being configured to, during a test operation:
store test write pattern data in response to a register address when the test command/address is a register write command and the register address, wherein each of the test write pattern data has the first predetermined number of bits, and
output test read pattern data in response to a test pattern data selection signal when the test command/address is a test read command and the test pattern data selection signal, wherein each of the test read pattern data has the first predetermined number of bits;
a row decoder, which generates a word line selection signal by decoding a row address;
a column decoder, which generates a column selection signal by decoding a column address;

a memory cell array, which outputs data from memory cells selected by the word line selection signal and the column selection signal;

a read path unit, the read path unit being configured to serialize the data output from the memory cell array to generate n read data, wherein each of the n read data has the first predetermined number of bits; and a test read data generation unit, the test read data generation unit being configured to, during the test operation:
generate n test read data by comparing the test read pattern data with each of the n read data at a first data rate, wherein the comparing is performed on a basis of a second predetermined number of bits, and wherein each of the n test read data has a third predetermined number of bits, and generate the n test read data at a second data rate, wherein the second data rate is lower than the first data rate.

15. The test system as claimed in claim 14, wherein the semiconductor memory device further includes a command and address generator, the command and address generator being configured to, during the test operation:
generate the register address together with the register write command, generate the row address together with a test active command, or generate the column address together with a test write command by receiving and decoding the test command/address in response to the test clock signal, or
generate the column address and the test pattern data selection signal together with the test read command by receiving and decoding the test command/address and a special-purpose signal in response to the test clock signal.

16. The test system as claimed in claim 15, wherein the test pattern data selection signal is generated using an address that is not used for indicating the column address among address signals included in the test command/address, and using the special-purpose signal.

17. The test system as claimed in claim 16, wherein the special-purpose signal includes at least one of a clock enable signal, a command and address bus inversion signal, and a reset signal, which is used for a special purpose during a normal operation.

18. The test system as claimed in claim 15, wherein the test pattern data storage includes a register unit, the register unit including a plurality of registers,
wherein the test pattern data storage is configured to store test pattern data in, or output test pattern data from, one of the plurality of registers in response to the register address or the test pattern data selection signal, and
wherein the test pattern data storage is further configured to:
transmit the test write pattern data as the test pattern data in response to the register write command and the register address, and
transmit the test pattern data as the test read pattern data in response to the test read command and the test pattern data selection signal.

19. The test system as claimed in claim 15, wherein the test read data generation unit includes n test read data generators, and
wherein each of the n test read data generators includes a comparison unit configured to generate test read data by comparing the test read pattern data with the read data, and wherein the comparing is performed on a basis of the second predetermined number of bits.

20. The test system as claimed in claim 19, wherein semiconductor memory device further includes a test write data generation unit, the test write generation unit being configured to:
copy, or invert and copy, each of n test write data at a third data rate, wherein the third data rate is lower than the first data rate or equal to or higher than the second data rate, and wherein each of the test write data has a fourth predetermined number of bits, and
generate n write data at the first data rate, wherein each of the write data has the first predetermined number of bits, and
wherein the test command/address is applied in response to rising and falling edges of the test clock signal,
wherein each of the n test write data is applied in response to a rising edge of the test write clock signal having a higher frequency than the test clock signal, and
wherein each of the n test read data is generated in response to a rising edge of a clock signal having a frequency equal to or lower than the frequency of the test write clock signal.

* * * * *